US006487670B1

(12) United States Patent
Racino et al.

(10) Patent No.: US 6,487,670 B1
(45) Date of Patent: Nov. 26, 2002

(54) METHODS AND SYSTEMS FOR DETECTING AND FOR RESPONDING TO CONNECTION OF A BATTERY TO A LOGIC DEVICE

(75) Inventors: Greg A. Racino, Austin, TX (US); Michael C. Wood, Pflugerville, TX (US); James R. Feddeler, Austin, TX (US); George E. Baker, Austin, TX (US); Edward M. Stellini, Austin, TX (US); Linda Reuter Nuckolls, Austin, TX (US); Timothy E. Barnard, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/261,875

(22) Filed: Mar. 2, 1999

(51) Int. Cl.[7] .................................................. G06F 1/00
(52) U.S. Cl. ........................ 713/340; 713/330; 320/132
(58) Field of Search .................................... 713/310–320, 713/324, 330, 340; 307/66, 64, 65, 68; 320/120, 135–136, 46–48, 15, 39, 30, 32, 14, 132

(56) References Cited

U.S. PATENT DOCUMENTS

| | | | | | |
|---|---|---|---|---|---|
| 4,295,060 A | * | 10/1981 | McGehee | .................... | 307/273 |
| 5,199,032 A | | 3/1993 | Sparks et al. | ................... | 371/3 |
| 5,270,946 A | * | 12/1993 | Shibasaki et al. | ........... | 364/492 |
| 5,349,668 A | * | 9/1994 | Gladstein et al. | ........... | 713/300 |
| 5,434,739 A | | 7/1995 | Heck | ........................... | 361/84 |
| 5,631,537 A | * | 5/1997 | Armstrong | ................... | 320/15 |
| 5,632,039 A | * | 5/1997 | Walker et al. | ............... | 713/300 |
| 5,646,509 A | * | 7/1997 | Berglund et al. | ............. | 320/48 |
| 5,739,596 A | * | 4/1998 | Takizawa et al. | ............. | 307/66 |
| 5,825,100 A | * | 10/1998 | Kim | ............................. | 307/66 |
| 6,037,749 A | * | 3/2000 | Parsonage | .................... | 320/132 |
| 6,047,380 A | * | 4/2000 | Nolan et al. | ................. | 713/324 |
| 6,101,611 A | * | 8/2000 | Yoshida | ....................... | 713/340 |
| 6,141,764 A | * | 10/2000 | Ezell | .......................... | 713/340 |
| 6,266,776 B1 | * | 7/2001 | Sakai | .......................... | 713/300 |

OTHER PUBLICATIONS

Applicant's Declaration Under 37 C.F.R. §1.132 including Exhibit A and Exhibit B, dated Sep. 8, 1999.
Dallass Semiconductor Corporation, "Battery Management Products", pp. 1–6, Jul. 2, 1998.
Dallas Semiconductor Corporation, "Battery Management Product Overview", pp. 1–3, Jul. 2, 1998.
MAXIM, "Digitally Adjustable LCD Bias Supplies", MAX1620/MAX1621, pp. 1–20, 1997.

\* cited by examiner

Primary Examiner—Peter Wong
Assistant Examiner—Raymond N Phan
(74) Attorney, Agent, or Firm—Joanna G. Chiu

(57) ABSTRACT

A system comprising a supply voltage isolation module (50), and a battery detector (52), both responsive to a battery pin (41). The system further including a voltage detection module (54) responsive to a voltage supply pin (42), where the voltage detection module (54) compares a supply voltage from the voltage supply pin (42) to a threshold. The system also including control logic (56) responsive to the battery detector (52) and the voltage detection module (54). Also disclosed are methods for responding to connection of a battery (36) to a logic device (12), placing a logic device (12) into a low power state in response to connection of a battery (36) to the logic device (12), and detecting a battery condition for a logic device (12) having a battery pin (41).

31 Claims, 5 Drawing Sheets

METHODS AND SYSTEMS FOR DETECTING AND FOR RESPONDING TO CONNECTION OF A BATTERY TO A LOGIC DEVICE

FIELD OF THE INVENTION

This invention relates generally to logic devices, and more specifically to detecting and responding to battery conditions within logic devices.

BACKGROUND OF THE INVENTION

In many battery powered systems, such as those in the portable electronics market, logic devices, such as microprocessors and microcontrollers, play the role of the main controller and/or the power management unit. In this role, it is important to protect the logic device's internal logic states and volatile memory (RAM, control registers, logic states, etc.) as long as possible when batteries become weak or are removed. Therefore, a need exists to provide systems and methods to detect and respond to various different battery conditions for logic devices.

DETAILED DESCRIPTION OF THE DRAWINGS

Generally, the present invention relates to methods and systems that detect battery conditions within logic devices. In one embodiment, the present invention relates to a system including a supply voltage isolation module and a battery detector, both responsive to a battery pin. The system further includes a voltage detection module responsive to a voltage supply pin, where the voltage detection module compares a supply voltage from the voltage supply pin to a threshold. The system also includes control logic that is responsive to the battery detector and the voltage detection module.

An alternate embodiment relates to a method of placing a logic device into a low power state in response to connection of a battery to the logic device. The method includes detecting connection of the battery to a battery pin of the logic device and detecting a voltage level of the battery. A test is performed on the voltage level of the battery in response to detecting connection of the battery to the battery pin of the logic device. The logic device is placed into a low power state in response to performing the test on the voltage level of the battery.

Another alternate embodiment relates to a method of responding to connection of a battery to a logic device. The method includes detecting connection of the battery to a battery pin of the logic device, where the logic device has a voltage supply pin. A voltage level of the battery is detected, and activity of at least a portion of the logic device is delayed for a first time period based on a charging time of a capacitive element coupled to the voltage supply pin of the logic device.

Yet another embodiment relates to a method of detecting a battery condition for a logic device having a battery pin. The method includes detecting connection of the battery to the battery pin of the logic device, and detecting a voltage level of the battery. A first test is performed based on the voltage level of the battery when the logic device is in a first mode of operation. A second test is performed based on the voltage level of the battery when the logic device is in a second mode of operation.

Another alternate embodiment relates to a method of responding to connection of a battery to a logic device. The method includes detecting connection of the battery to a battery pin of the logic device, and detecting a voltage level of the battery. A test is performed on the voltage level of the battery to detect a bounce condition on the battery pin of the logic device.

Yet another alternate embodiment relates to a system comprising a logic device having a battery pin. The system further includes a battery detector for detecting connection of a battery to the battery pin of the logic device and comparing the voltage level of the battery to a battery threshold. The system also includes control logic responsive to the battery detector, where the control logic places the logic device into a low power state.

Figure 1:
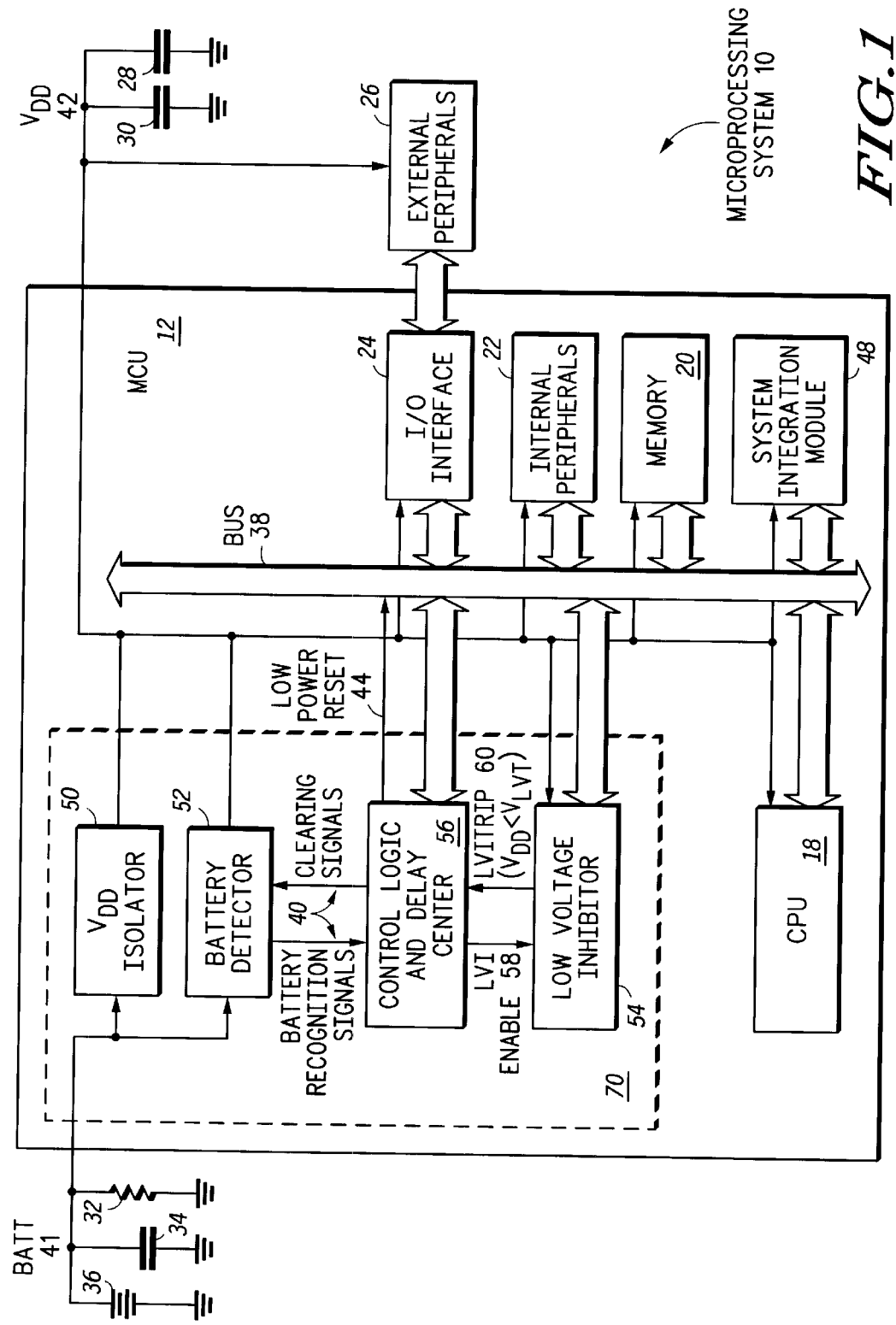
FIG. 1 is a block diagram of a microprocessing system 10 in accordance with an embodiment of the present invention.

Referring to FIG. 1, a microprocessing system 10 is shown. Microprocessing system 10 includes a logic device, such as microcontroller (MCU) 12, along with external circuitry, as illustrated in FIG. 1. In alternate embodiments, MCU 12 can be replaced with various microprocessors, microcontrollers, or other types of logic devices. MCU 12 includes central processing unit (CPU) 18, memory 20, internal peripherals 22, system integration module (SIM) 48, input/output (I/O) interface 24, control logic and delay counter 56, and low voltage inhibitor (LVI) 54, which are all bidirectionally coupled to processor bus 38. MCU 12 also includes battery detector 52, coupled to control logic and delay counter 56, battery node 41 (BATT 41). MCU 12 also contains supply voltage (Vdd) isolator 50 coupled to battery node 41. The external circuitry includes a battery 36 that is connectable to the battery node 41 of MCU 12, charge elements, such as capacitors 28, 30, and 34, and passive elements, such as resistor 32.

A first terminal of battery 36, a first terminal of bypass capacitor 34, and a first terminal of resistor 32 are coupled to battery node 41. First terminals of reservoir capacitor 30 and bypass capacitor 28 are coupled to a supply voltage (Vdd) node 42. Vdd node 42 is coupled to supply voltage (Vdd) isolator 50, battery detector 52, control logic and delay counter 56, LVI 54, CPU 18, memory 20, internal peripherals 22, SIM 48, I/O interface 24, and external peripherals 26. I/O interface 24 is bidirectionally coupled to external peripherals 26. Second terminals of battery 36, bypass capacitor 34, resistor 32, reservoir capacitor 30, and bypass capacitor 28 are all coupled to ground.

MCU 12 includes a battery protection circuit 70 which includes the Vdd isolator 50, battery detector 52, control logic and delay counter 56, and LVI 54. Battery detector 52 is bidirectionally coupled to control logic and delay counter 56 via control signals 40. The control signals 40 include battery recognition signals and clearing signals. Control logic and delay counter 56 is coupled to LVI 54 by LVI enable signal 58 and low voltage inhibitor trip signal (LVITRIP) 60. Control logic and delay counter 56 selectively outputs a low power reset signal (one of the signals found within bus 44) to bus 38 to place MCU 12 in a low power state.

Bypass capacitor 34, filters out noise from node 41 and provides bounce protection for high frequency bounces when battery 36 is connected to node 41. A high frequency bounce is a small dip in the battery voltage that is not detected by the battery protection circuit 70. In this case, the capacitor 34 continues to provide current to MCU 12. When battery 36 is disconnected from battery node 41, the voltage at node 41 is sufficiently pulled down by resistor 32 to be detected by battery detector 52. When battery 36 is removed, capacitor 30 supplies Vdd node 42 with enough voltage to retain RAM memory, control registers, logic states, etc., within MCU 12, for an extended period of time during a low power state. Bypass capacitor 28 serves to filter noise from Vdd node 42 during normal operation.

Vdd isolator 50 of FIG. 1 operates by detecting whether the voltage at Vdd node 42 is greater than the battery node 41 voltage. If the voltage at battery node 41 falls below Vdd node 42, then Vdd isolator 50 isolates battery node 41 from Vdd node 42. MCU 12 then continues to run powered with current from reservoir capacitor 30 from Vdd node 42. In this case, the external reservoir capacitor is isolated from battery 36. That is, when battery node 41 is connected to Vdd node 42, battery 36 is charging the external reservoir capacitor 30, and when Vdd isolator 50 isolates battery node 41, the external reservoir capacitor 30 is discharging, thus supplying current to MCU 12.

LVI 54 is enabled by LVI enable signal 58 from control logic 56, as shown in FIG. 1. When LVI 54 is enabled, it monitors Vdd node 42 to determine when it falls below the low voltage threshold ($V_{LVT}$). When Vdd falls below $V_{LVT}$, LVI 54 sends a signal, LVITRIP 60, to control logic and delay counter 56. If LVI 54 is disabled, it no longer draws any current and no longer outputs LVITRIP 60 when Vdd falls below VLVT. That is, the output LVITRIP 60 is driven low or inactive.

Battery detector 52 of FIG. 1 provides battery recognition signals (part of control signals 40) to control logic 56. These battery recognition signals alert MCU 12 when the voltage at battery node 41 ($V_{BATT}$) has fallen below a minimum battery threshold voltage ($V_{NOBATT}$). These signals also alert MCU 12 when $V_{BATT}$ has fallen below the voltage at Vdd node 42.

Figure 2:
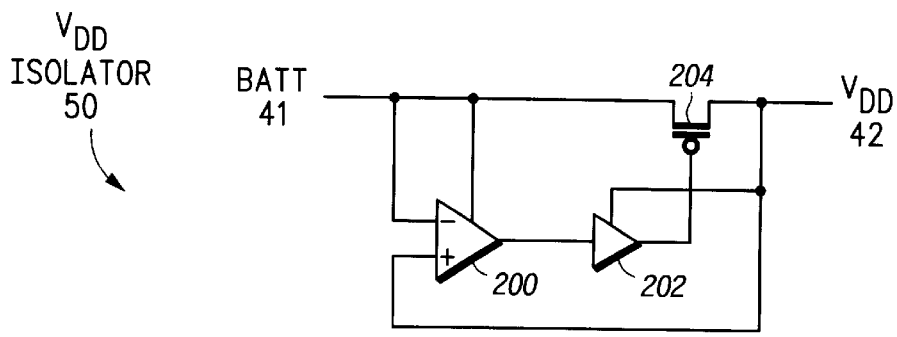
FIG. 2 is a schematic diagram of an embodiment of the Vdd isolator 50 of FIG. 1.

FIG. 2 illustrates an embodiment of the voltage supply (Vdd) isolator 50 of FIG. 1. In this embodiment, battery node 41 is coupled to a control line and negative terminal of comparator 200, and to a first terminal of p-channel transistor 204. The positive terminal of comparator 200 is coupled to Vdd node 42, a second terminal of p-channel transistor 204, and a power terminal of buffer 202. The output of comparator 200 is coupled to the 45 input of buffer 202, and the output of buffer 202 is coupled to the gate of p-channel transistor 204. Therefore, when transistor 204 is turned off, battery node 41 is isolated from Vdd node 42.

Figure 3:
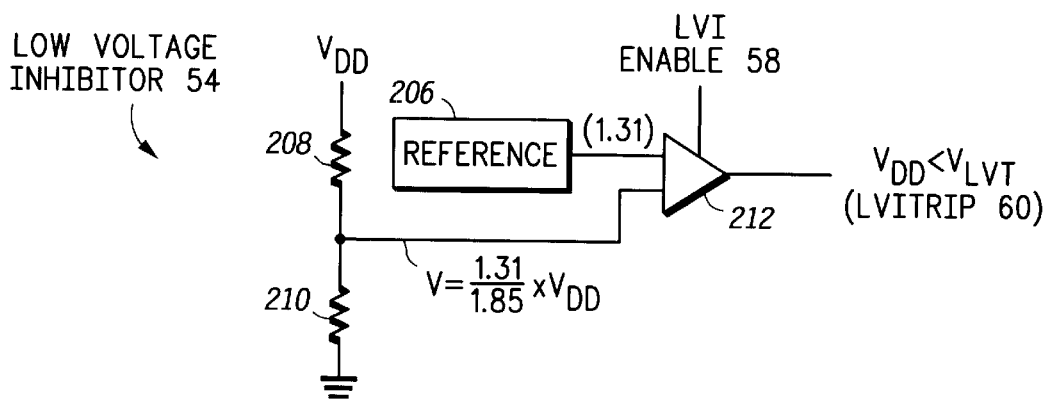
FIG. 3 is a schematic diagram of an embodiment of the low voltage inhibitor 54 of FIG. 1.

FIG. 3 illustrates an embodiment of low voltage inhibitor (LVI) 54 of FIG. 1. In this embodiment, Vdd is coupled to a first terminal of resistor 208, and a second terminal of resistor 208 is coupled to a first terminal of resistor 210 and a second terminal of comparator 212. The second terminal of resistor 210 is coupled to ground. A reference voltage 206 is input to the first terminal of comparator 212, and LVI enable signal 58 is coupled to a control line of comparator 212. The output of comparator 212 provides the output signal LVITRIP 60 to control logic and delay counter 56. Therefore, when LVI enable 58 disables comparator 212, the output signal LVITRIP 60 is driven low or inactive. In one embodiment, the reference voltage is approximately 1.31 volts and the low voltage threshold, $V_{LVT}$, is approximately 1.85 volts. Resistors 208 and 210 can be scaled to form a voltage divider that provides the selected voltage level to the second terminal of comparator 212. In one embodiment, resistors 208 and 210 are scaled to provide a voltage level that is 1.31/1.85 of Vdd.

Figure 4:
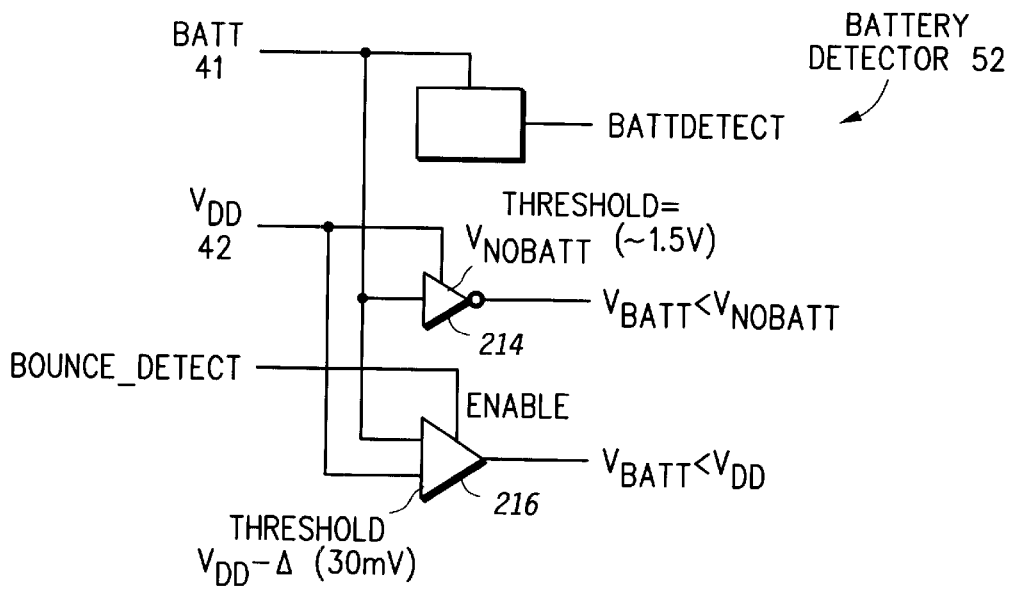
FIG. 4 is a schematic diagram of an embodiment of the battery detector 52 of FIG. 1.

FIG. 4 illustrates an embodiment of battery detector 52 of FIG. 1. In this embodiment, battery node 41 is coupled to an input of inverter 214, and a first terminal of comparator 216. Vdd node 42 is coupled to a power terminal of inverter 214, and a second input of comparator 216. A bounce_detect signal is input to the control line of comparator 216 in order to enable or disable comparator 216. In one embodiment, the threshold of inverter 214 is approximately "0.3*Vdd" volts such that when battery node 41 is less than "0.3*Vdd" volts, the output of inverter 214 indicates that $V_{BATT}$ (the voltage of battery node 41) is less than $V_{NOBATT}$ (which is the threshold of inverter 214, or "0.3*Vdd" volts in this case). In one embodiment, the threshold of comparator 216 is "Vdd−offset," where Vdd is the voltage at Vdd node 42, and the offset in this embodiment is approximately 30 millivolts. The output of comparator 216 indicates whether $V_{BATT}$ is less than Vdd.

The offset represents an error factor to compensate for process variations. Ideally, battery detector 52 detects exactly when $V_{BATT}$ falls below Vdd. However, due to process variations, $V_{BATT}$ may be detected as being less than Vdd when in fact, it is not. Therefore, in one embodiment, the offset is designed to be 30 mV where $V_{BATT}$ must fall at least 30 mV below Vdd before $V_{BATT}$ is detected as being less than Vdd. Alternate embodiments may design for different offsets, or may not include an offset at all.

Figure 5:
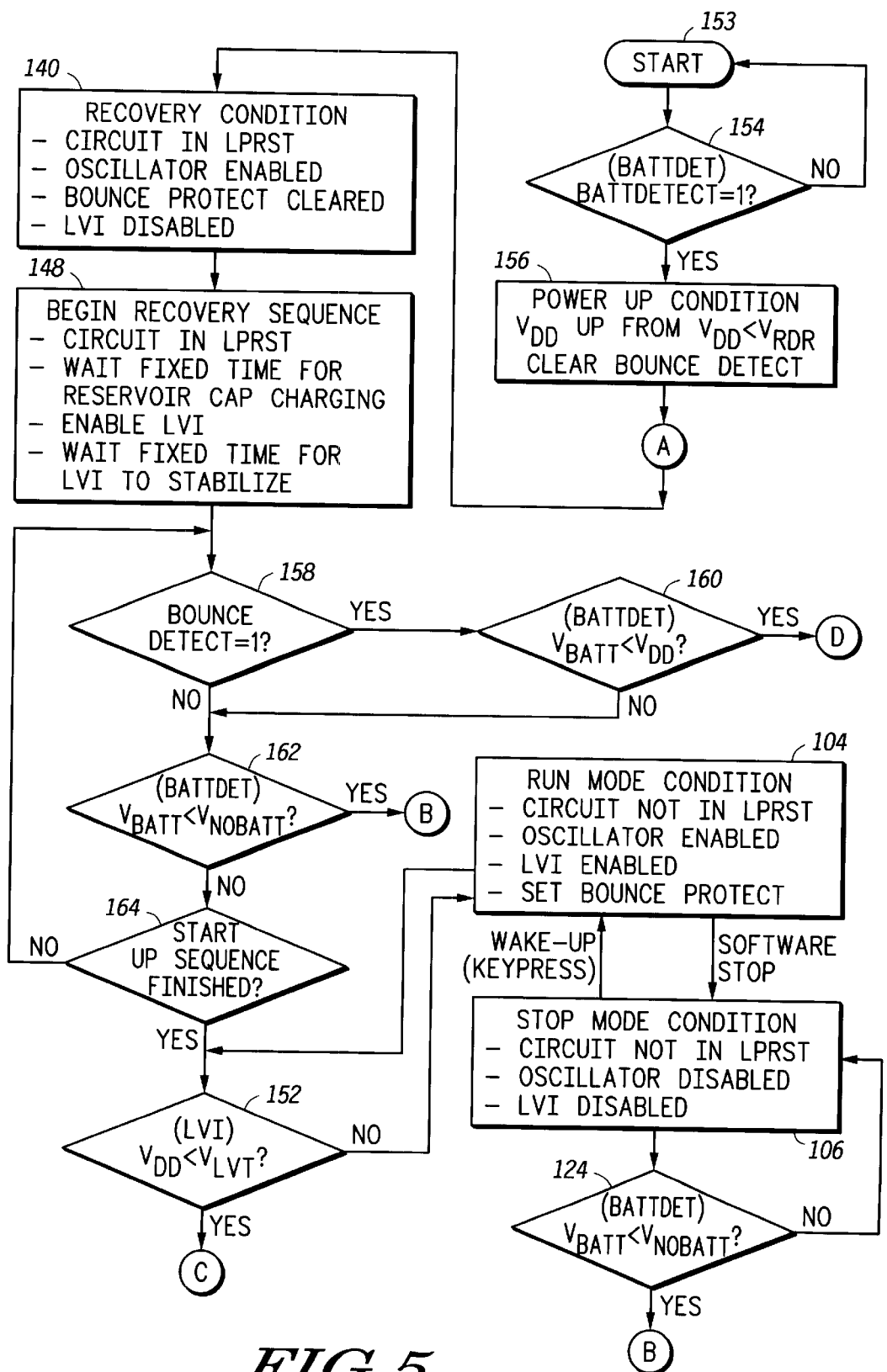
FIGS. 5–7 are flow diagrams of a method of responding to battery conditions.
Figure 6:
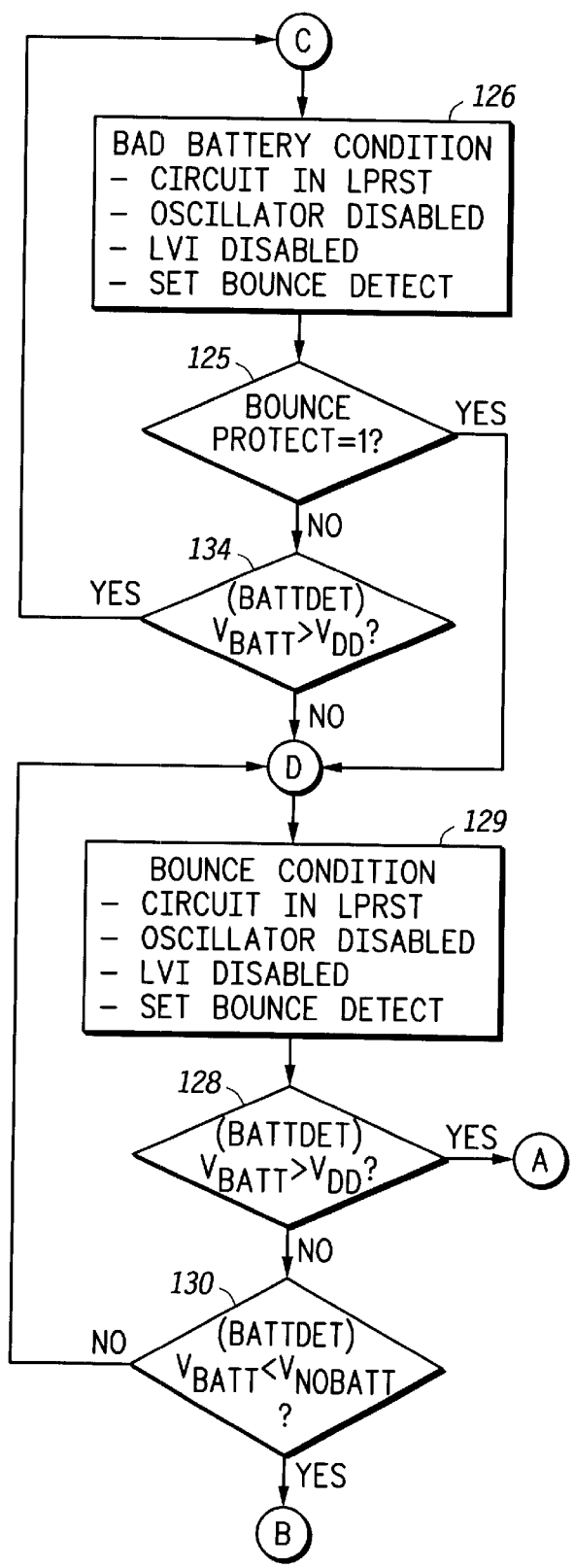
Figure 7:
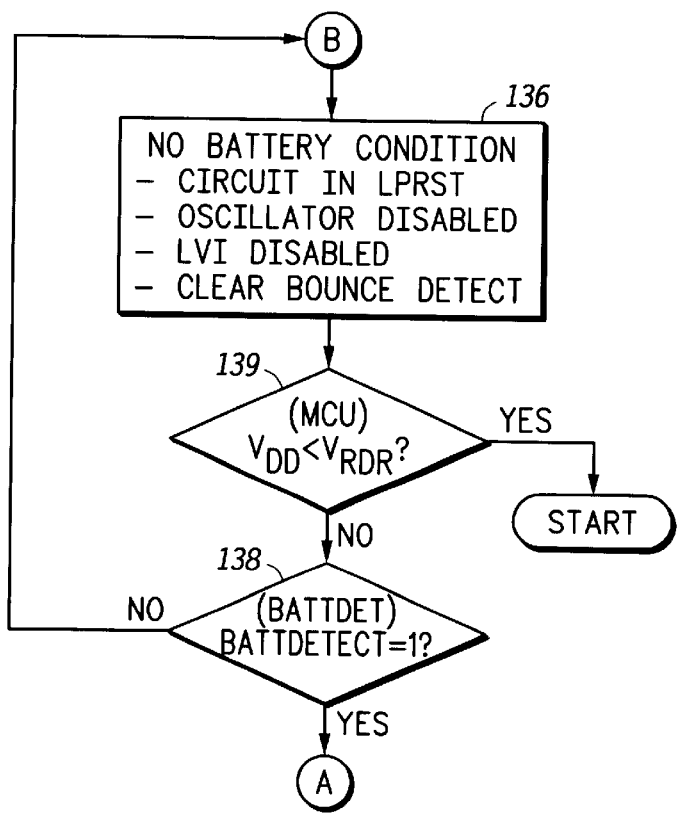

FIGS. 5–7 further describe the operation of a particular embodiment of the battery protection circuit 70 in detecting various types of battery conditions. FIG. 5 includes power up condition (block 156), recovery condition (block 140), run mode condition (block 104), and stop mode condition (block 106). FIG. 6 includes bad battery condition (block 126) and bounce condition (block 129). FIG. 7 includes no battery condition (block 136).

At the start 153 of the flow diagram of FIG. 5, both Vdd (voltage at Vdd node 42) and $V_{BATT}$ (voltage at battery node 41) are assumed to be discharged, or approximate zero. That is, battery 36 is completely drained or no battery is connected at all, and reservoir capacitor 30 is completely discharged to a level below a random-access memory (RAM) data retention voltage level ($V_{RDR}$). In this case, all the RAM information is lost since a minimum voltage of $V_{RDR}$ is required to retain information stored in RAM. When battery detector 52 detects a rising edge on battery node 41, BATTDETECT is 1 at decision diamond 154, and logic device 12 enters a power up condition (block 156). In this state, Vdd rises above $V_{RDR}$, and a bounce_protect flag is cleared. A recovery sequence begins since a rising edge on battery node 41 indicates that a battery has been inserted.

The recovery conditions are initialized in block 140. MCU 12 is placed in a low power state by the control logic 56 asserting the low power reset signal. The oscillator (not shown) is enabled, LVI 54 is disabled, and the bounce_ protect flag is cleared. The oscillator is used to generate clock signals used by MCU 12 and can be a standard oscillator such as those found in logic devices (e.g. microcontrollers and microprocessors) used today.

The recovery startup sequence begins with block 148. During the recovery start-up sequence, the battery protection circuit 70 waits for a fixed time for reservoir capacitor 30 to charge. The fixed time is determined by the resistance and capacitance of reservoir capacitor 30. That is, the wait time is based on the reservoir capacitor's time constant. In one embodiment, the wait time is approximately 32 milliseconds. LVI 54 is then enabled. However, LVI 54 has a stabilization time (thus resulting in a second delay time period), which, in one embodiment, is approximately 64 microseconds. Upon stabilization, LVI 54 monitors the voltage on Vdd node 42 and compares it to the low voltage threshold ($V_{LVT}$). The start-up sequence is completed once LVI 54 stabilizes.

During the recovery sequence, various checks are performed simultaneously (represented by decision diamonds 158, 160, 162, and 164). Therefore, during the fixed time required for reservoir capacitor 30 to charge and LVI 54 to stabilize, flow continues with decision diamond 158. If the bounce_detect signal is 1 at decision diamond 158, the recovery sequence was entered into from the bounce condition beginning at block 129, which will be described further in reference to FIG. 6. If bounce_detect flag is 1, and battery detector 52 detects that $V_{BATT}$ is less than Vdd, then the recovery sequence is exited and flow returns to the bounce condition, block 129.

However, if $V_{BATT}$ is not less than Vdd or if bounce_ detect is 0, flow continues to decision diamond 162. If battery detector 52 detects that $V_{BATT}$ is less than the minimum battery threshold voltage ($V_{NOBATT}$), flow continues to block 136 (of FIG. 7) at point B which indicates that the battery has been removed. That is, if $V_{BATT}$ falls below $V_{NOBATT}$, battery 36 is assumed to be bad or removed, and the system must wait until a new battery is inserted or the bad battery is replaced. If $V_{BATT}$ is not less than $V_{NOBATT}$, flow continues to decision diamond 164. If the start-up sequence has not yet finished, i.e. the fixed time described above for capacitor charging and LVI stabilization has not ended, flow returns to decision diamond 158, and the checks are repeated until the recovery sequence is exited at points D or B, or until the start-up sequence ends (detected at decision diamond 164).

If the start-up sequence ends, and the recovery system was not exited, flow continues to decision diamond 152. At this point, LVI 54 is enabled and has stabilized, and it monitors Vdd to determine if it is above threshold voltage $V_{LVT}$. If Vdd is greater than $V_{LVT}$, MCU 12 enters run mode at block 104. During run mode (also referred to as execution mode), MCU 12 is no longer in a low power state, the bounce_ protect flag is set to 1, and both the oscillator and LVI 54 are enabled. When MCU 12 reaches a stop instruction within the code running on MCU 12, flow continues to block 106 which represents MCU 12 in stop mode. In stop mode, both LVI 54 and the oscillator are disabled, yet MCU 12 is not in the low power state which protects Vdd during various battery conditions. MCU 12 wakes up and returns to run mode when a wakeup signal is received. This wakeup signal can refer to a key press or any other system interrupt capable of waking up MCU 12.

When MCU 12 is in run mode (block 104), LVI 54 continuously monitors Vdd. If, at decision diamond 152, Vdd falls below $V_{LVT}$, flow continues through point C to the bad battery condition at block 126 (of FIG. 6). The falling Vdd can represent two different situations. If, at decision diamond 152 (the previous check), Vdd was never detected to be greater than $V_{LVT}$, MCU 12 never entered into run mode and the bounce_protect flag was not set. This could indicate that a weak battery was inserted at point A of the flow diagram. However, if MCU 12 did enter run mode and the bounce_protect flag is set, then the fall in Vdd to below $V_{LVT}$ can indicate that battery 36 is either in a bounce situation or is becoming weak or bad from a good battery condition.

During a bounce condition, $V_{BATT}$ can momentarily fall below Vdd and then return to its original level. Once $V_{BATT}$ does fall below Vdd, Vdd isolator 50 substantially isolates battery node 41 from Vdd node 42. One embodiment allows for a recovery sequence to determine whether battery 36 is weak and truly falling below Vdd or simply in the middle of a bounce. In case of a bounce, $V_{BATT}$ will once again return to a level slightly above Vdd. Therefore, if a dip in Vdd to a level below $V_{LVT}$ occurs while MCU 12 is in run mode (block 104), flow continues from decision diamond 152 to block 126 (of FIG. 6), as described above. Since bounce_ protect is set to 1 in this case, flow continues from decision diamond 125 to the bounce condition sequence at block 129.

During a bounce condition (as illustrated by FIG. 6), MCU 12 remains in a low power state, and both the oscillator and LVI 54 are disabled. Bounce_detect is also set to 1 in block 129. The bounce_detect signal allows for protection against longer bounces as well as double bounce situations where $V_{BATT}$ returns to above Vdd, but then falls again. Therefore, the bounce_detect signal holds the system in a bounce condition until the full bounce situation is over, as determined by decision diamonds 128 and 130. At decision diamond 128, battery detector 52 determines whether $V_{BATT}$ has recovered from a bounce. If $V_{BATT}$ remains below Vdd, then flow continues to decision diamond 130 where battery detector 52 determines whether $V_{BATT}$ has become low enough to fall below a minimum battery threshold $V_{NOBATT}$. If $V_{BATT}$ remains above $V_{NOBATT}$, flow will return to block 129. The system remains in a bounce condition until $V_{BATT}$ either exceeds Vdd or falls to a level below $V_{NOBATT}$, where flow continues to block 136, indicating a no battery condition.

However, if $V_{BATT}$ recovers to a level above Vdd, flow continues from decision diamond 128 to block 140, restarting a recovery sequence. In this case, bounce_protect flag is cleared (e.g. set to 0) as the system attempts to recover and exit the low power state. The bounce_detect signal has not yet been cleared; therefore, at decision diamond 158, flow will continue to decision diamond 160. If $V_{BATT}$ once again falls to a level below Vdd during the fixed time of the recovery sequence, flow will return to the bounce condition of block 129, thereby exiting the recovery sequence. This situation can indicate a double bounce, where $V_{BATT}$ recovered momentarily, and then fell once again below Vdd. The bounce detect condition beginning at block 129 would once again wait until $V_{BATT}$ either recovers (exceeds Vdd) or falls below battery threshold $V_{NOBATT}$.

If $V_{BATT}$ has not fallen below Vdd during the fixed time of the recovery sequence, battery detector 52 determines, at 162, whether $V_{BATT}$ has fallen below $V_{NOBATT}$. If so, flow continues from decision diamond 162 to the no battery condition at 136 (of FIG. 7) where MCU 12 awaits for a battery replacement. However, if $V_{BATT}$ remains above $V_{NOBATT}$, and the start-up sequence ends (meaning the fixed time for the recovery sequence has elapsed), LVI 54 determines whether Vdd is sufficiently charged by comparing Vdd to low voltage threshold $V_{LVT}$ at step 152. If Vdd is above $V_{LVT}$, MCU 12 enters the run mode, thereby exiting the low power state and recovering from a battery bounce situation. However, if Vdd is not charged to a level above $V_{LVT}$, flow falls through to the bad battery condition beginning with block 126. Note that if bounce_protect flag is cleared upon entering the recovery condition (block 140), and if MCU 12 does not enter run mode (block 104), bounce_protect flag is not set (i.e. remains cleared) upon entering block 126.

In the case that bounce_protect is not set at step 125, flow falls through to decision diamond 134 where battery detector 52 determines whether $V_{BATT}$ is greater than Vdd. If battery 36 is weak, and $V_{BATT}$ has not yet fallen below Vdd, flow returns to block 126, remaining in the bad battery condition. Therefore, so long as bounce_protect is not 1, and $V_{BATT}$ remains above Vdd, the system remains in the bad battery condition waiting for the battery to be removed. Once battery 36 is removed, $V_{BATT}$ falls below Vdd, and flow continues to block 129 through point D, which indicates a bounce condition. With battery 36 removed, flow falls through decision diamond 128 to decision diamond 130, and from decision diamond 130 to block 136, indicating a no battery condition.

It is also possible that at decision diamond 134, $V_{BATT}$ falls below Vdd without indicating that a battery has been removed. The flow from decision diamond 134 to bounce condition at block 129 can also indicate that a bounce is occurring during a bad battery condition, where battery 36 is weak but not yet below $V_{NOBATT}$. If $V_{BATT}$ falls below Vdd, flow enters the bounce condition at block 129. If, at decision diamond 128, battery detector 52 detects that $V_{BATT}$ has once again risen above Vdd, flow returns to the recovery sequence at block 140. However, if Vdd is below $V_{LVT}$ when the recovery sequence ends (meaning the weak battery was unable to sufficiently charge reservoir capacitor 30), MCU 12 does not immediately enter run mode, and flow returns to block 126, the bad battery condition. Therefore, a weak battery or a bounce in a bad battery condition will not place MCU 12 in run mode, thereby protecting MCU 12 from such battery conditions.

If MCU 12 enters run mode (block 104), and a software stop is detected, MCU 12 enters a stop mode condition (block 106) and LVI 54 is disabled. In stop mode, LVI 54 does not alert control logic and delay counter 56 with LVITRIP 60 when Vdd falls below $V_{LVT}$. However, battery detector 52 continues to monitor to determine whether $V_{BATT}$ falls below $V_{NOBATT}$. If, at decision diamond 124, $V_{BATT}$ remains above $V_{NOBATT}$, flow returns to block 106 where MCU 12 continues to wait for a wakeup signal. However, if $V_{BATT}$ falls below $V_{NOBATT}$, flow continues to no battery condition at block 136 where MCU 12 goes into a low power state.

As described above, there are various ways to enter block 136, the no battery condition, where MCU 12 waits for a battery to be replaced (as illustrated in FIG. 7). Once in this no battery condition, MCU 12 is in a low power state, the oscillator is disabled, LVI 54 is disabled, and the bounce_ detect signal is cleared. If, at decision diamond 139, MCU 12 detects that Vdd has fallen below RAM data retention voltage $V_{RDR}$, all RAM data is lost, and flow returns to start 153 where both Vdd and $V_{BATT}$ are dead, as described above, and MCU 12 is awaiting a new battery. If Vdd remains above $V_{RDR}$, RAM data is retained, and flow continues to decision diamond 138 where battery detector 52 determines whether a battery has been connected to the system. So long as Vdd remains above $V_{RDR}$ when a battery connection is detected (BATTDETECT=1), flow returns to the recovery condition of block 140 at point A, where point A indicates that a battery has been inserted. Flow then continues to the recovery sequence again.

Figure 8:
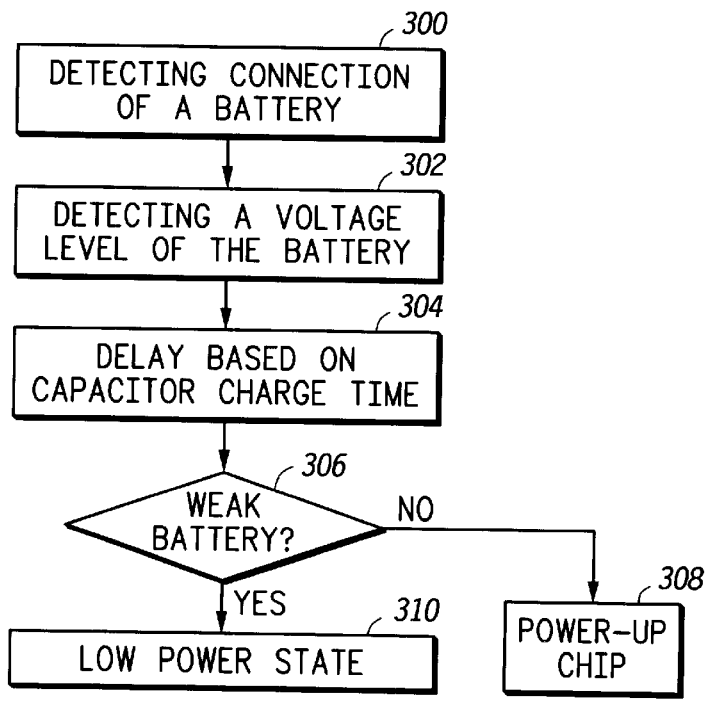
FIG. 8 is a flow diagram of a method of detecting and responding to connection of a weak battery to a logic device.

FIG. 8 illustrates a particular method in accordance with an embodiment of the present invention that addresses insertion of a weak battery. When a logic device, such as MCU 12, is awaiting a battery insertion, battery detector 52 detects the connection of a battery, represented by block 300. Battery detector 52 then detects a voltage level on a pin connected to the battery, such as battery pin 41 ($V_{BATT}$), as shown in block 302. MCU 12 can be designed to offer different delays similar to the recovery sequence described above. In one embodiment, the delay is based on the charge time of the reservoir capacitor 30. Alternatively, the system can be designed with variable delays based on other factors. During the delay of block 304, various tests are performed. For example, battery detector 52 compares $V_{BATT}$ to Vdd to determine if a bounce condition is detected. Battery detector 52 also compares $V_{BATT}$ to a battery threshold ($V_{NOBATT}$) to detect a bad battery or the removal of the battery.

Upon finishing the delay, flow continues to decision diamond 306 where a weak battery condition is tested, such as by low voltage inhibitor (LVI) 54 comparing supply voltage Vdd to a supply voltage threshold ($V_{LVT}$) to determine if Vdd is sufficiently charged to power up the chip. That is, Vdd should be sufficiently charged to allow MCU 12 to exit from the low power state and enter run mode (or execution mode). If a weak battery is inserted into MCU 12, Vdd would not be sufficiently charged, and flow continues to block 310 where MCU 12 remains in a low power state. However, if a good battery, such as a battery capable of sufficiently charging reservoir capacitor 30, is inserted into MCU 12, flow continues to block 308 where MCU 12 exits the low power state. Alternative embodiments may include other modules in MCU 12 to perform the tests described above or other battery condition tests. Also, alternate embodiments may perform other tests used to accomplish similar results as those tests described above.

The method described with respect to FIG. 8 provides for protection against weak battery insertions. If a weak battery is initially inserted in the system, MCU 12 remains in a low power state. This prevents a full power-up on a weak battery condition and helps protect MCU 12 from possible damage.

The method described with respect to FIGS. 5–7 perform various different tests when MCU 12 is in different modes of operation, thereby providing improved control and flexibility in the protection of MCU 12 from various battery conditions. The illustrated method allows for the detection of various length bounces, as well as double bounces, and provides for a recovery sequence to handle bounce conditions on a pin connected to a battery. Therefore, embodiments of the present invention prevent unnecessary power-ups that drain the system unnecessarily or damage MCU 12.

Although the present invention has been described with reference to specific embodiments, further modifications and improvements will occur to those skilled in the art. Also, those skilled in the art can appreciate that variations in design and elements may still accomplish the functions of the present invention. Therefore, it is to be understood that the invention encompasses all such modifications that do not depart from the scope of the invention as defined in the appended claims, and equivalents thereof.

What is claimed is:

1. A system comprising:
   a supply voltage isolation module, wherein the supply voltage isolation module selectively connects a battery pin to a voltage supply pin;
   a battery detector, the supply voltage isolation module and the battery detector responsive to the battery pin, wherein the battery detector compares a battery voltage received from the battery pin to a battery threshold and compares the battery voltage received from the battery pin to the supply voltage from the voltage supply pin;

a voltage detection module responsive to the voltage supply pin, the voltage detection module comparing a supply voltage from the voltage supply pin to a threshold; and control logic responsive to the battery detector and the voltage detection module.

2. The system of claim 1, further comprising a capacitive element coupled to the voltage supply pin.

3. The system of claim 1, further comprising a battery coupled to the battery pin.

4. The system of claim 1, wherein the battery detector compares a battery voltage received from the battery pin to a battery threshold.

5. The system of claim 4, wherein the battery detector compares a battery voltage received from the battery pin to the supply voltage from the voltage supply pin.

6. The system of claim 1, wherein the supply voltage isolation module selectively connects the battery pin to the voltage supply pin based on the battery voltage and based on a comparison between the supply voltage and the battery voltage.

7. The system of claim 6, wherein the supply voltage exceeds the battery voltage and the supply voltage isolation module disconnects battery pin from the voltage supply pin.

8. The system of claim 6, wherein the battery detector indicates that the battery voltage exceeds the supply voltage and the supply voltage isolation module connects the battery pin to the voltage supply pin.

9. The system of claim 1, wherein the control logic outputs a low power reset signal in response to at least one of the battery detector and the voltage detection module.

10. A method of placing a logic device into a low power state in response to connection of a battery to the logic device, the method comprising:

detecting connection of the battery to a battery pin of the logic device;

detecting a voltage level of the battery;

performing a test on the voltage level of the battery in response to the step of detecting connection of the battery to the battery pin of the logic device, wherein the logic device has a voltage supply pin and wherein performing the test on the voltage level of the battery comprises:

comparing the supply voltage level of the voltage supply pin to a supply voltage threshold; and placing the logic device into a low power state in response to the step of performing a test on the voltage level of the battery.

11. The method of claim 10, wherein the logic device has a voltage supply pin and wherein the step of performing a test on the voltage level of the battery comprises the step of comparing the voltage level of the battery to a supply voltage from the voltage supply pin.

12. The method of claim 11, further comprising the step of comparing the voltage level of the battery to a battery threshold.

13. The method of claim 10, wherein the logic device is a microprocessor.

14. The method of claim 10, further comprising the step of powering up at least a portion of the logic device.

15. A method of responding to connection of a battery to a logic device, the method comprising:

detecting connection of the battery to a battery pin of the logic device, the logic device having a voltage supply pin;

detecting a voltage level of the battery; and delaying activity of at least a portion of the logic device for a first time period based on a charging time of a capacitive element coupled to the voltage supply pin of the logic device and a stabilization time of a voltage detection module within the logic device.

16. The method of claim 15, further comprising the step of comparing a voltage level of the voltage supply pin to a supply voltage threshold.

17. The method of claim 16, further comprising the step of powering up at least a portion of the logic device.

18. The method of claim 16, further comprising the step of placing at least a portion of the logic device into a low power state.

19. The method of claim 15, further comprising the step of performing a test on the voltage level of battery to detect a bounce condition on the battery pin of the logic device.

20. A method of detecting a battery condition for a logic device having a battery pin, the method comprising:

detecting connection of the battery to the battery pin of the logic device;

detecting a voltage level of the battery;

performing a first test based on the voltage level of the battery when the logic device is in an execution mode of operation, wherein the logic device has a voltage supply pin, and wherein performing the first test comprises comparing a voltage level from the voltage supply pin to a supply voltage threshold; and performing a second test based on the voltage level of the battery when the logic device is in a low power mode of operation.

21. The method of claim 20, wherein the step of performing the second test on the voltage level of the battery comprises the step of comparing the voltage level of the battery to a battery threshold.

22. The method of claim 21, further comprising the step of placing the logic device into a low power state in response to at least one of the first test and the second test.

23. The method of claim 22, further comprising the steps of:

detecting connection of a second battery to the battery pin of the logic device; and performing a logic device recovery sequence in response to the step of detecting connection of the second battery.

24. A method of responding to connection of a battery to a logic device, the method comprising:

detecting connection of the battery to a battery pin of the logic device;

detecting a voltage level of the battery; and performing a test on the voltage level of the battery to detect a bounce condition on the battery pin of the logic device.

25. The method of claim 24, further comprising:

disabling a voltage detection module within the logic device; and placing at least a portion of the logic device into a low power state.

26. The method of claim 25, wherein the step of performing the test comprises comparing the voltage level from a supply voltage pin of the logic device to the voltage level of the battery for a first time.

27. The method of claim 26, wherein the step of performing the test comprises a step of comparing the voltage level of the battery to a battery threshold voltage level.

28. The method of claim 26, further comprising a step of initiating a recovery sequence to power-up at least a portion of the logic device in response to performing the test.

29. The method of claim 28, further comprising a step of comparing the voltage level from a supply voltage pin of the logic device to the voltage level of the battery for a second time.

30. The method of claim 28, further comprising a step of comparing the voltage level from a volt supply pin of the logic device to a voltage threshold.

31. A system comprising:
   a logic device having a battery pin and a voltage supply pin;
   a battery detector responsive to the battery pin, the battery detector detecting connection of a battery to the battery pin of the logic device and comparing the voltage level of the battery to a battery threshold;
   a voltage detection module that compares a voltage received at the voltage supply pin to a supply voltage threshold; and
   control logic responsive to the battery detector, the control logic placing at least a portion of the logic device into a low power state.

* * * * *